United States Patent [19]
Nakayama et al.

[11] Patent Number: 4,916,413
[45] Date of Patent: Apr. 10, 1990

[54] PACKAGE FOR PIEZO-OSCILLATOR

[75] Inventors: Iwao Nakayama; Kazushige Ichinose; Hiroyuki Ogiso, all of Minowa, Japan

[73] Assignee: Matsushima Kogyo Kabushiki Kaisha, Nagano, Japan

[21] Appl. No.: 273,456

[22] Filed: Nov. 18, 1988

[30] Foreign Application Priority Data

| Nov. 20, 1987 | [JP] | Japan | 62-293558 |
| Nov. 20, 1987 | [JP] | Japan | 62-293559 |
| Nov. 20, 1987 | [JP] | Japan | 62-293561 |
| Nov. 20, 1987 | [JP] | Japan | 62-293562 |
| Nov. 20, 1987 | [JP] | Japan | 62-177439[U] |

[51] Int. Cl.$^4$ ............................................. H03B 1/00
[52] U.S. Cl. .................... 331/68; 331/108 D; 331/116 R; 331/158; 331/187
[58] Field of Search ............... 331/68, 108 C, 108 D, 331/116 R, 116 FE, 116 M, 154, 155, 156, 157, 158, 159, 160, 161, 162, 163, 164, 187; 310/348

[56] References Cited

U.S. PATENT DOCUMENTS 4,677,397   6/1987   Nakayama et al. ............... 331/187

FOREIGN PATENT DOCUMENTS

| 2931357 | 2/1981 | Fed. Rep. of Germany . |
| 0018803 | 1/1987 | Japan . |
| 0038604 | 2/1987 | Japan . |
| 0039907 | 2/1987 | Japan . |
| 0061406 | 3/1987 | Japan . |
| 2055232 | 2/1981 | United Kingdom . |

Primary Examiner—David Mis
Attorney, Agent, or Firm—Blum Kaplan

[57] ABSTRACT

A piezo-oscillator includes a semiconductor element having at least an oscillating circuit. A piezo-vibrator having leads extending therefrom is connected to the semiconductor element by a plurality of lead terminals. The semiconductor, vibrator and lead terminals are contained within a unitary resin package.

23 Claims, 8 Drawing Sheets

PACKAGE FOR PIEZO-OSCILLATOR

BACKGROUND OF THE INVENTION

This invention relates to piezo-oscillators, and in particular, to a piezo-oscillator in which a piezo-vibrator and oscillating circuit are packaged as a single unit.

Reference is made to FIGS. 1 and 2 wherein a conventional piezo-oscillator utilizing a crystal oscillator which includes a crystal vibrator is shown. In the conventional oscillator, a semiconductor element 41 is connected to lead terminals 43 by fine gold wires 42 by wire bonding. Semiconductor element 41 and lead terminals 43 are packaged in a resin package 50 using the transfer molding method.

A recess 51 is formed by a protrusion of the forming die during the transfer molding process. A crystal vibrator 44 is positioned within recess 51 so that it is aligned with semiconductor element 41 in the longitudinal direction of resin package 50. Crystal vibrator 44 is connected to crystal vibrator connecting lead terminals 45, 46 which are connected to crystal vibrator connecting lead terminals 49 by solder 47. An epoxy resin 48 fills the recess to bury crystal vibrator 44 and is then dried.

These piezo-vibrators have been less than satisfactory. In the conventional oscillator, it becomes necessary for the recess to have a certain minimum thickness resulting in an increase in the package dimensions. Additionally, because the interface between the epoxy resin which fills the recess and the transfer molded resin is large, water may penetrate the interface causing abnormal operation of the piezo-vibrator.

Accordingly, it is desireable to provide a piezo-oscillator which overcomes the shortcomings of the prior art device described above.

SUMMARY OF THE INVENTION

A piezo-oscillator includes a semiconductor element and a piezo-vibrator, the semiconductor element having at least one function which is the oscillating of the piezo-vibrator. Lead terminals are wire bonded to the semiconductor element and are connected to lead terminals of the piezo-vibrator. The semiconductor element and piezo-vibrator are packaged in a single resin at a temperature which is lower than that of the melting point of the materials forming the piezo-vibrator.

Accordingly, it is an object of the present invention to provide an improved piezo-oscillator.

Another object of the invention is to provide a small oscillator which prevents the penetration of water and accordingly has a high resistance to humidity.

A further objection of the invention is to provide a piezo-oscillator which has reduced size in the lateral dimensions of the package.

Yet another object of the invention is to provide a piezo-oscillator in which the thickness of the resin which forms the package is reduced.

Still another object of the invention is to provide a piezo-oscillator in which the noise generated by capacitative coupling between the piezo-vibrator connecting lead terminals and adjacent lead terminals is prevented.

Still other objects and advantages of the invention will in part be obvious and will be apparent from the specification.

The invention accordingly comprises the features of construction, combination of elements, and arrangement of parts which will be exemplified in the constructions hereinafter set forth and the scope of the invention will be indicated in the claims.

BRIEF DESCRIPTION OF THE DRAWINGS

For a better understanding of the invention, reference is had to the following description taken in connection with the accompanying drawings, in which.

DETAILED DESCRIPTION OF THE PREFERRED EMBODIMENTS

Figure 1:
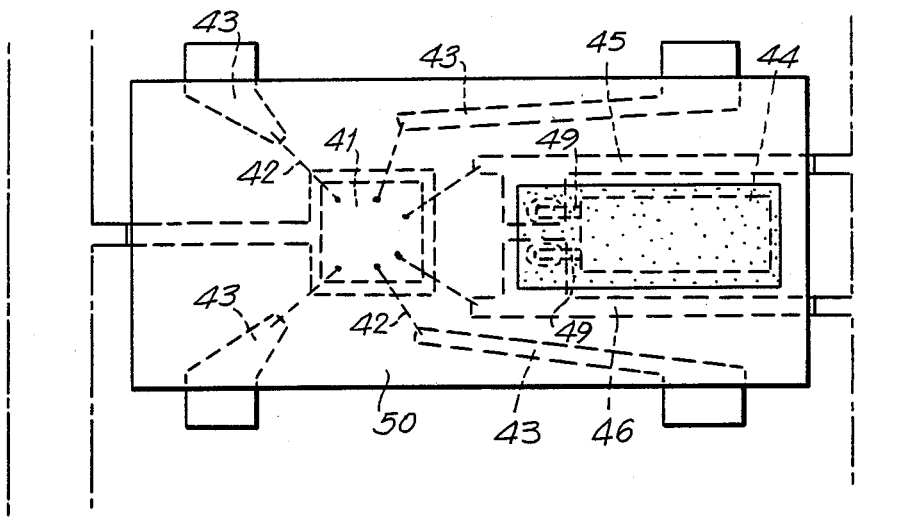
FIG. 1 is a top plan view of a piezo-oscillator constructed in accordance with the prior art.
Figure 2:
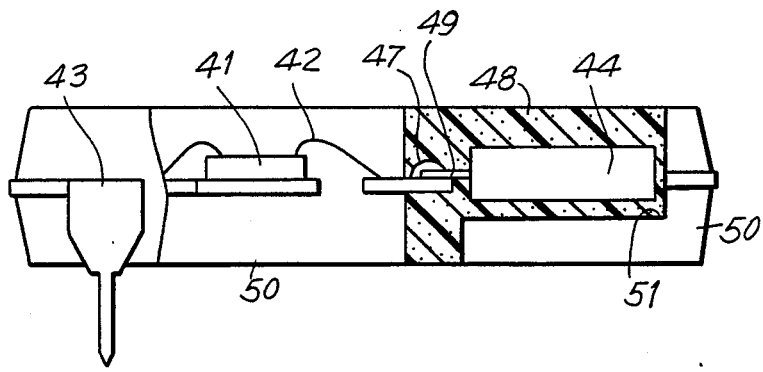
FIG. 2 is a sectional view of the piezo-oscillator depicted in FIG. 1 constructed in accordance with the prior art.
Figure 3:
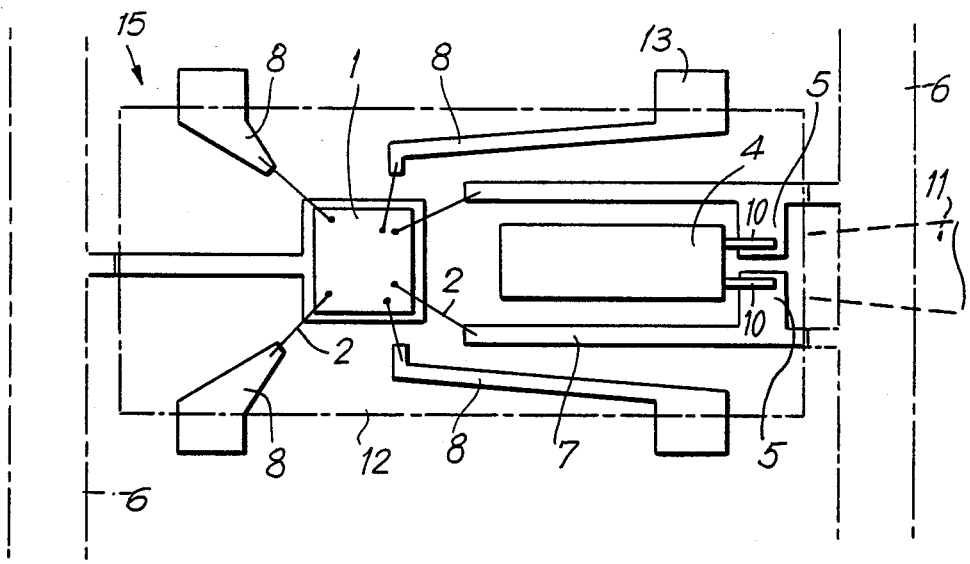
FIG. 3 is a top plan view of a crystal oscillator constructed in accordance with a first embodiment of the invention.
Figure 4:
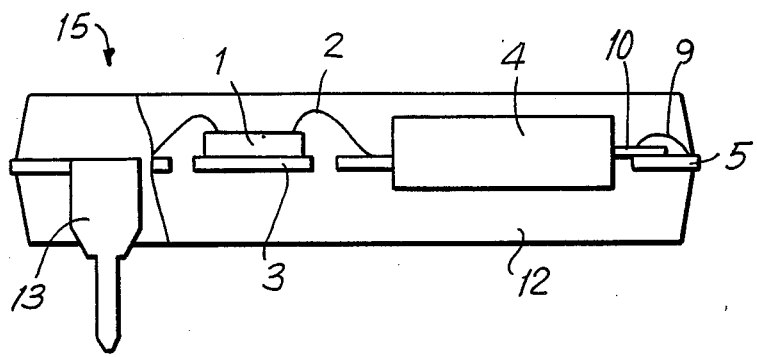
FIG. 4 is a cross-sectional view of the crystal oscillator depicted in FIG. 3 constructed in accordance with the invention.

Reference is first made to FIGS. 3 and 4 wherein a piezo-oscillator generally indicated at 15, constructed in accordance with the invention is provided. Piezo-oscillator 15 is a crystal oscillator utilizing a crystal vibrator 4.

Piezo-oscillator 15 includes a lead frame having a die pad 3. A semiconductor element 1 is affixed to the upper surface of die pad 3. A plurality of lead terminals 7, 8 are connected to semiconductor element 1 by gold wires 2 by wire bonding. In piezo-oscillator 15, six lead terminals are provided by way of the example, however, the number of lead terminals need not be limited to this number.

Lead terminals 7 act as two crystal vibrator connecting lead terminals. Each of crystal vibrator connecting lead terminals 7 is connected to semiconductor element 1 by gold wire bonding at one end and the remaining end of lead terminals 7 extend and connect to an outer frame 6 of the lead frame. A pair of crystal vibrator leads 10 extending from a cylindrical crystal vibrator 4 are connected to crystal vibrator connecting pads 5 formed on crystal vibrator connecting lead terminals 7 by solder 9. Lead terminals 8 extend to form outer leads 13.

An injection port 11 is disposed at a position which faces the end surface of crystal vibrator 4 to allow for transfer molding of piezo-oscillator 15. In this way, resin is injected towards crystal vibrator 4 and fills the space around crystal vibrator 4 such as the space above crystal vibrator 4 before it begins to set allowing the thickness of the package to be reduced. Accordingly, by injecting an epoxy resin through port 11 by the transfer molding process, semiconductor element 1, gold wires 2, crystal vibrator 4 and lead terminals 7 and 8 are packaged together in a single, epoxy resin package 12.

Figure 5:
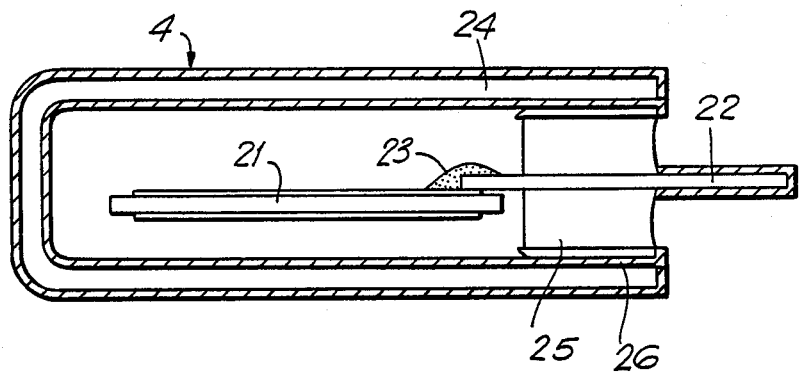
FIG. 5 is a cross-sectional view of a crystal vibrator utilized in the piezo-oscillator of the present invention.

The transfer mold process is performed at a temperature lower than the melting point of the materials which form crystal vibrator 4. As can be seen from FIG. 5, crystal vibrator 4 includes a crystal vibrating piece 21 connected to a plug lead 22 by solder 23. Additionally, solder is used as a seal 26 to fill the gap between a cylindrical cap 24 and a plug 25. Accordingly, the transfer molding process must occur at a temperature which is lower than the melting point of solder 23 and seal 26. Although the melting point of the solder used in an exemplary embodiment is 183° C., it has been observed that the temperature of the solder begins to soften in the vicinity of 175° C. and therefore, the transfer molding process should be conducted at temperatures of less than 170° C. to provide a safety barrier.

Figure 6:
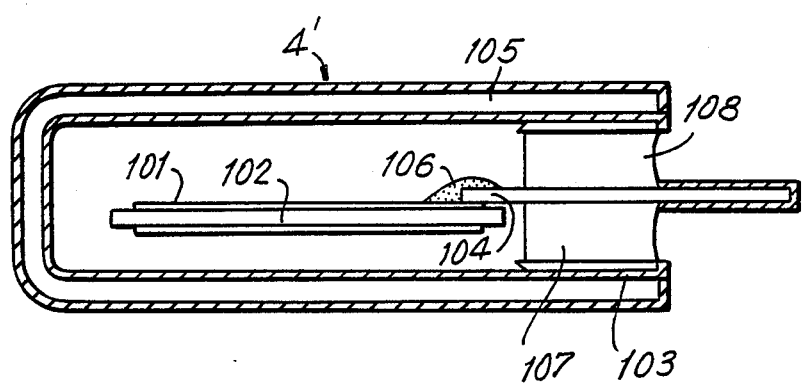
FIG. 6 is a cross-sectional view of another embodiment of a crystal vibrator.

The above described embodiment was directed to a piezo-oscillator in which a piezo-vibrator is constructed using a solder having a melting point of 183° C. Reference is now made to FIG. 6 wherein a cross-sectional view of a heat resistant piezo-vibrator, indicated at 4', constructed in accordance with another embodiment of the invention is provided. A piezo-vibrating piece 102 is affixed to an inner lead 104 of a plug 108 by a heat resistant solder 106 which is plated thereon. Electrofilm 101 is deposited on piezo-vibrating piece 102. Next, the piezo-vibrating piece 102 is hermetically placed within a metal casing 105 on which a heat resistant solder 103 is plated to act as a heat resistant sealant.

Figure 7:
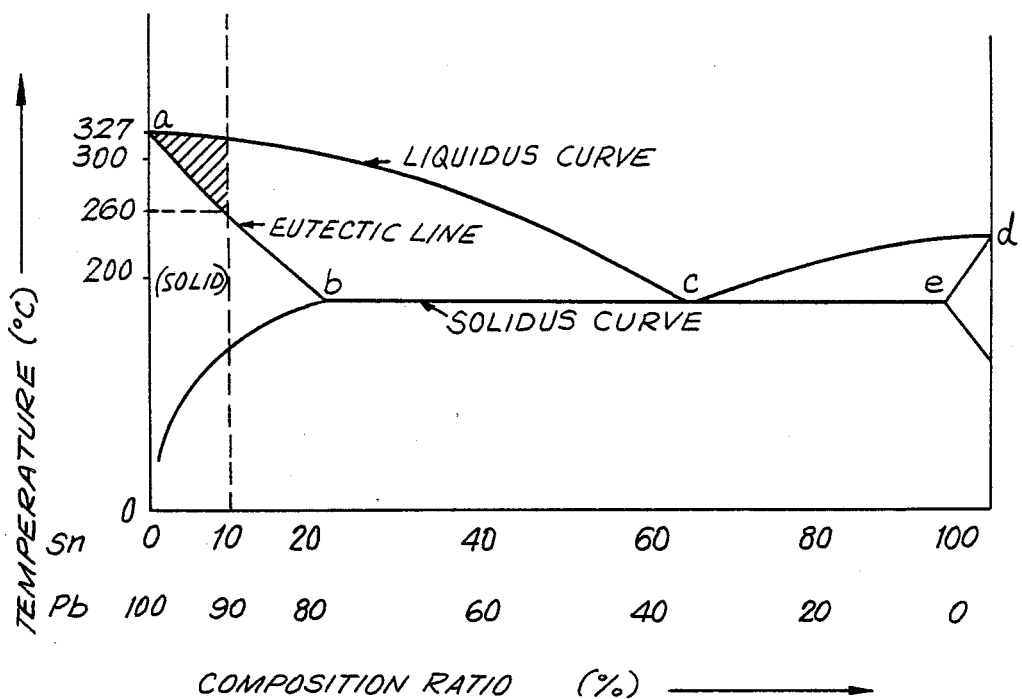
FIG. 7 is a graphical representation of the states of solder utilized in accordance with the present invention.

Reference is made to FIG. 7 in which the state of the heat resistant solder as a function of temperature and percentage composition of lead is provided. In the exemplary embodiments discussed above, the heat resistant solder actually used in the piezo-vibrator of FIG. 6 is a solder which contains 90% or more of lead.

Figure 8:
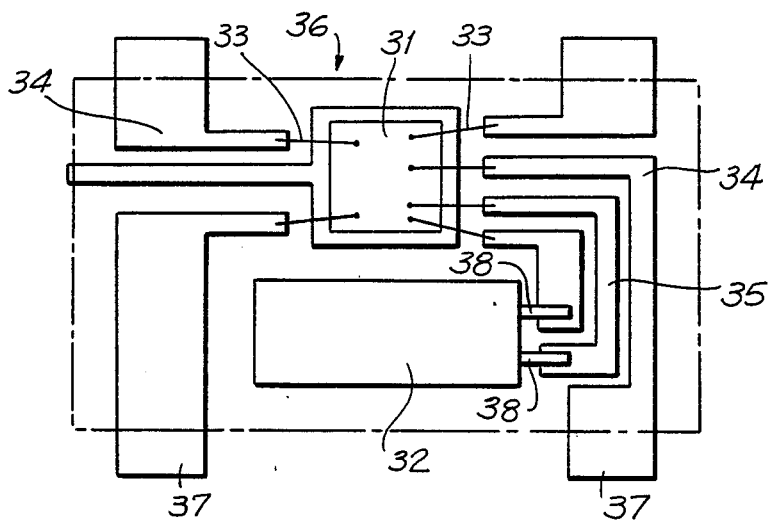
FIG. 8 is a top plan view of another embodiment of a piezo-oscillator constructed in accordance with the present invention.

Reference is now made to FIG. 8 wherein another embodiment of a piezo-oscillator, generally indicated at 36, constructed in accordance with the invention is provided. A semiconductor element 31 and a crystal vibrator 32 are disposed parallel to each other in the longitudinal direction of crystal vibrator 32. Lead terminals 34 extending in a step fashion are wire bonded at its one end to semiconductor element 31 by gold wires 33. The wire bonding occurs in the longitudinal direction of crystal vibrator 32 producing a lateral dimension of piezo-oscillator 36. At its other ends, lead terminals 34 form outer leads 37. A pair of crystal vibrator terminals 35 are also formed in step fashion and are wire bonded to semiconductor element 33 at their one end and to crystal vibrator leads 38 at their other end. In this way, the lateral dimension of the piezo-oscillator can be reduced.

Figure 9:
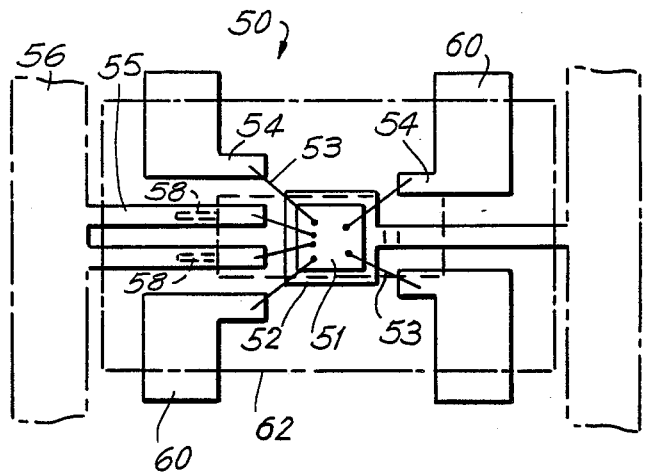
FIG. 9 is a top plan view of another embodiment of a piezo-oscillator constructed in accordance with the invention.
Figure 10:
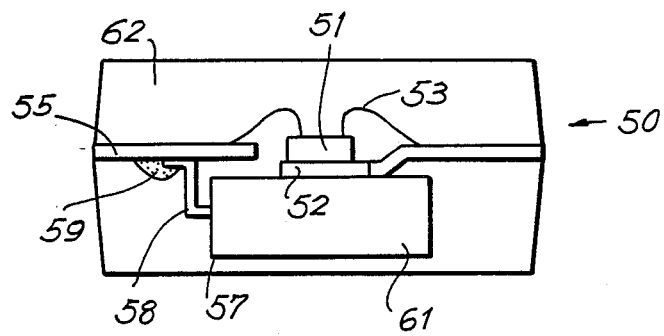
FIG. 10 is a cross-sectional view of the piezo-oscillator of FIG. 9.

Reference is now made to FIGS. 9 and 10 wherein another embodiment of the piezo-oscillator, generally indicated at 50 is provided. A piezo-vibrator 57 is affixed to the lower surface of a die pad 52 which forms a lead frame and which protrudes in the direction of piezo-vibrator 57. A semiconductor element 51 is affixed to the upper surface of die pad 52. Semiconductor element 51 is connected to a plurality of lead terminals 54 by gold wires 53 wire bonded to lead terminals 54. A pair of lead terminals 55 extending from an outer frame 56 of a lead frame act as crystal vibrator connecting lead terminals and are connected to semiconductor element 51 by wire bonding. Leads 58 of crystal vibrator 57 are connected to lead terminals 55 by solder 59.

Crystal vibrator 57 and semiconductor 51 are located on opposite surfaces of die pad 52. Therefore, crystal vibrator 57 is connected to the bottom surface of crystal vibrator connecting lead terminals 55, the side of connecting lead terminals to which semiconductor element 51 is not connected. A cap 61 which forms the outer shell of crystal vibrator 57 contacts the rear surface of die pad 52. A unitary package 62 for containing semiconductor element 51, die pad 52, crystal vibrator 57 and lead terminals 54, 55 is formed out of an epoxy resin by transfer molding. Lead terminals 54 extend outside of package 62 to form outer leads 60. In this example, crystal vibrator 57 can be positioned adequately in the lengthwise direction, the direction of thickness of the package, by bringing it into contact with die pad 52. As a result, variations in the positioning of the crystal vibrator can be eliminated and the thickness of the package formed by transfer molding can be minimized.

This example employs a dual in-line package with fourteen pins. However, provisions for smaller piezo-oscillators such as a dual in-line package with eight pins may be constructed in accordance with the invention if a semiconductor element and a crystal vibrator are disposed on the opposed surfaces of the die pad.

Figure 11:
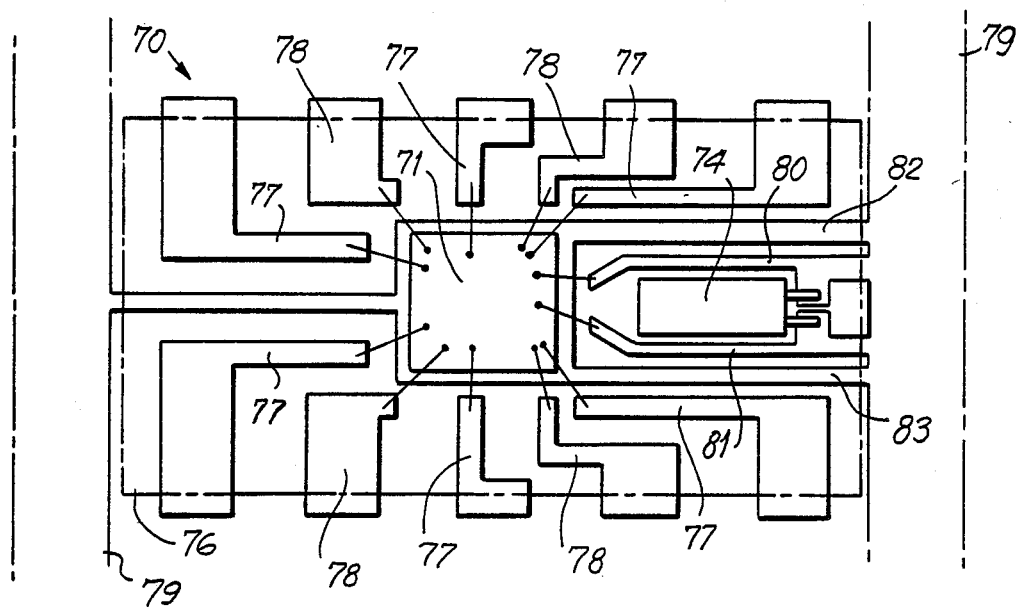
FIG. 11 is a top plan view of another embodiment of a piezo-oscillator constructed in accordance with the invention.
Figure 12:
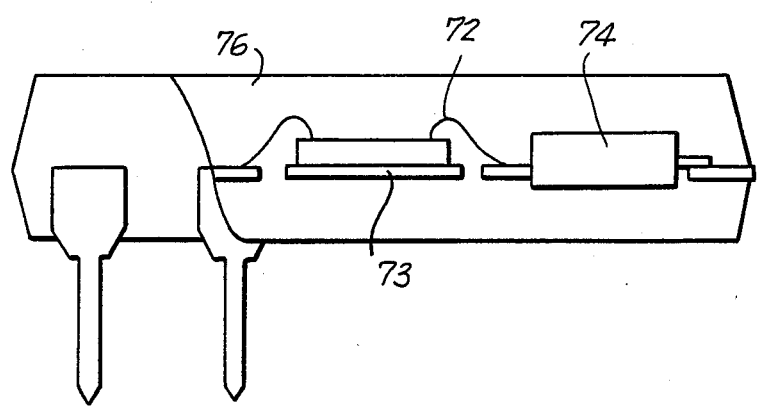
FIG. 12 is partial cross-sectional view of the piezo-oscillator of FIG. 11.

Reference is now made to FIGS. 11 and 12 wherein another embodiment of the present invention, generally indicated at 70, for a high precision crystal oscillator utilizing a crystal vibrator which prevents abnormal operation through the utilization of shielding lead terminals is provided. A die pad 73 and a crystal vibrator 74 are packaged within an epoxy resin package 76. A semiconductor element 71 is positioned on die pad 73. Crystal vibrator lead terminals 80 and 81 extend from crystal vibrator 74. Lead terminals 77 and 78 parallel to crystal vibrator connecting lead terminals 80 and 81 extend parallel to crystal vibrator connecting lead terminals. Semiconductor element 71 is connected to connecting lead terminals 80 and 81 and lead terminals 77 and 78 by gold wires 72. Shielding lead terminals 82, 83 extend between crystal vibrator connecting lead terminals 80, 81 and a pair of lead terminals 77, 78 parallel to crystal vibrator connecting lead terminals 80, 81 from die pad 73 to an outer frame 79 of a lead frame. Crystal vibrator 74 and crystal vibrator connecting lead terminals 80, 81 are disposed between shielding lead terminals 82 and 83. Semiconductor 71, crystal vibrator 74, lead terminals 77, 78, 80 and 81 are all packaged in an epoxy resin by transfer molding to form crystal oscillator 70 within unitary package 76.

Figure 13:
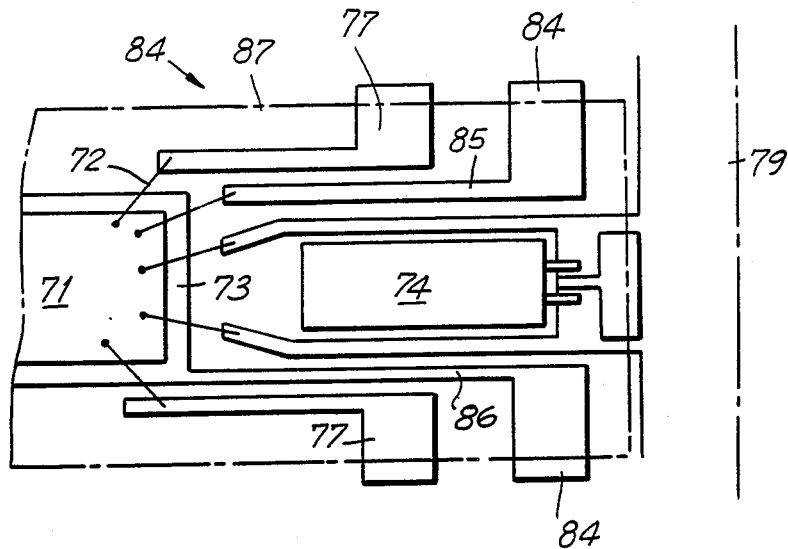
FIG. 13 is a top plan view of another embodiment of the piezo-oscillator constructed in accordance with the invention.
Figure 14:
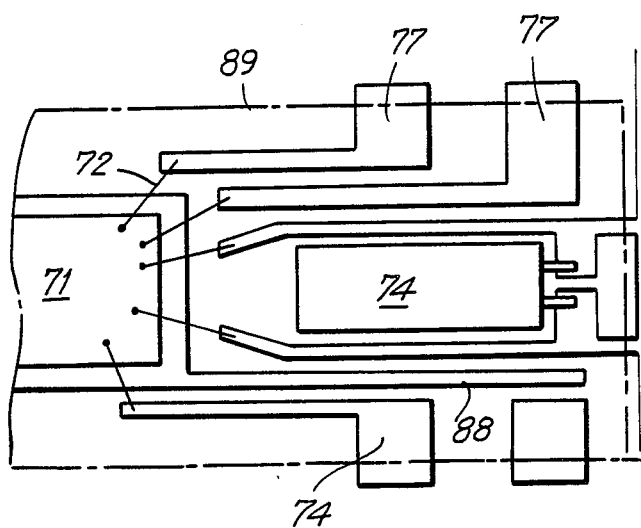
FIG. 14 is another top plan view of a piezo-oscillator constructed in accordance with the present invention.

Shielding lead terminals 82, 83 may be replaced by terminals having a potential which does not substantially vary, such as $V_{DD}$ or $V_{SS}$. Additionally, as shown in FIG. 13, in an alternative embodiment, generally indicated at 84, the shielding lead terminals may be replaced by lead terminals 85, 86 which do extend to form outer leads 84 which extend without the sides of package 87. The terminal 85 does not extend to die pad 73. In yet another embodiment, as shown in FIG. 14 shielding lead terminal 88 does not extend without of a package 89 and does not extend to die pad 73.

Figure 15:
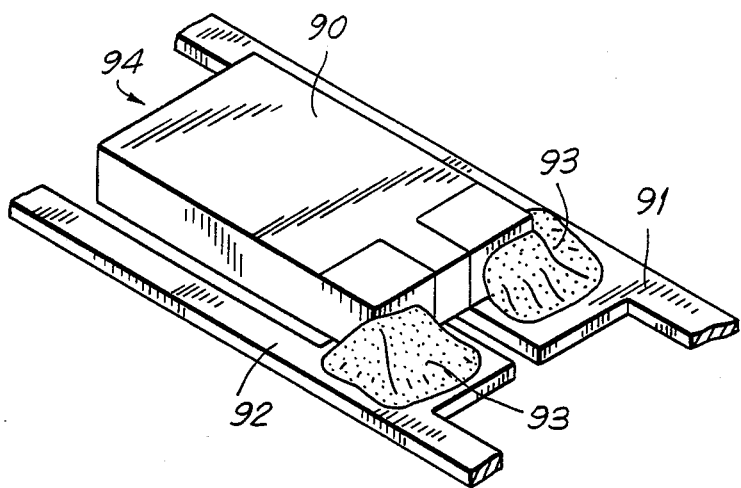
FIG. 15 is a perspective view of another embodiment of the piezo-oscillator constructed in accordance with the present invention.
Figure 16:
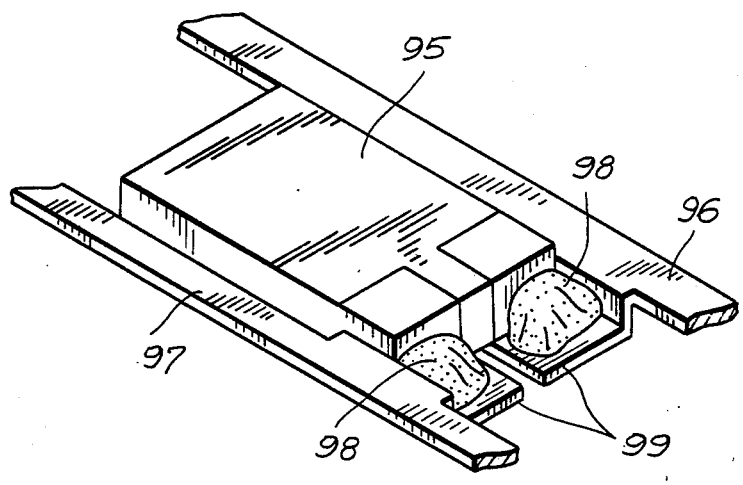
FIG. 16 is a perspective view of still another embodiment of a piezo-oscillator constructed in accordance with the present invention.

The above embodiments and examples employ a piezo-vibrator which is sealed by a cylindrical metal cap. However, the present invention is not limited to this type of piezo-vibrator; piezo-vibrators which are sealed by other methods may also be employed. For example, as shown in FIG. 15, a leadless chip shaped piezo-vibrator 90 may be utilized. Piezo-vibrator 90 is connected to lead terminals 91 and 92 using an adhesive 93 to form a piezo-oscillator 94. In yet another embodiment of the invention, shown in FIG. 16, a chip shaped piezo-vibrator 95 may be mounted to lead terminals 96, 97 having fixing portions 99 formed by bending lead terminals 96 and 97. Piezo-vibrator 95 is mounted on fixing portions 99 using an adhesive 98. Because the chip-shaped piezo-vibrator is located between the lead terminals, the thinness of the chip piezo-vibrator can be utilized at a maximum, making a thinner piezo-oscillator possible. The chip-shaped piezo-vibrator employed in the above described examples may be a crystal vibrator sealed in a flat casing of ceramic, glass, resin or the like.

In the above described embodiments, a dual in-line package is employed. However, a package such as an SIP, SOG or SOP may also be utilized. The embodiments also utilize a crystal vibrator. However, a lithium tantalate vibrator, a lithium molybdate vibrator or a ceramic vibrator may also be employed.

By providing a piezo-oscillator packaged in a single package which is formed at a temperature lower than the melting point of the materials which form the piezo-vibrator, deterioration of the piezo-vibrator can be decreased. Additionally, penetration of foreign matter such as water into the portion of the piezo-oscillator containing the piezo-vibrator can be prevented improving the resistance of the oscillator to humidity. Additionally, because molding is conducted in a single step, the resin filling process as it is conventionally practiced can be eliminated reducing the number of steps required to form a piezo-oscillator. Furthermore, formation of a recess in which the piezo-vibrator is placed is no longer needed. Therefore the thickness of the resin which forms the package can be reduced.

By providing the resin injection port at a position which faces the end surface or fixed portion of the piezo-vibrator to allow the resin to be injected towards the piezo-vibrator filling of the resin which is located about the thin piezo-vibrator can be completed before hardening of the resin begins. Additionally, the filling of the package with an insufficient amount of resin in the piezo-vibrator portion can be prevented. Additionally, the thickness of that portion can be further reduced resulting in a piezo-oscillator having a thin package. By providing a vibrator constructed with a casing and a plug utilized as a mounting base and shielding material which is constructed with a heat resistant solder containing 90% or more of lead a piezo-oscillator which can resist temperatures as high as 260° C. can be provided.

By providing a piezo-oscillator in which the semiconductor element and the piezo-vibrator are aligned in the longitudinal direction of the package production costs can be reduced. When the piezo-vibrator and semiconductor are disposed parallel to each other the longitudinal dimension of the package can be reduced. By connecting the semiconductor element in the lead terminals in the longitudinal direction of the piezo-vibrator the lateral dimension of the package may be reduced. Additionally, connecting the semiconductor element and the lead terminals along a conduction path in the longitudinal direction of the piezo-vibrator reduces the lateral dimension of the package. Positioning the piezo-vibrator and semiconductor element on opposite surfaces of the die pad reduces the longitudinal dimension of the package. Because the piezo-vibrator is positioned by bringing it into contact with the die pad, variations in the position of the crystal vibrator can be substantially eliminated and the thickness of the resin which forms the package can be reduced. By providing shielding lead terminals, the noise generated by capacitive coupling between the piezo-vibrator connecting lead terminals and adjacent lead terminals is prevented and the intervals at which the lead terminals are spaced can be minimized. Consequently, the side of the package is further reduced and a high precision small piezo-oscillator which prevents abnormal operation of the oscillator is provided. The present invention is most effective if it is applied to a high-impedance oscillating circuit which employs a vibrator with a low frequency such as 32.768 KHz.

It will thus be seen that the objects set forth above, among those made apparent from the preceding description are efficiently obtained and, some certain changes may be made in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all the generic and specific features of the invention herein described and all statements of the scope of the invention which as a matter of language might be said to fall therebetween.

What is claimed is:

1. A piezo-oscillator package comprising a piezo-vibrator having a casing with an end portion, electrode extensions extending proximate the end portion of said casing, a semiconductor element having oscillating circuit means for oscillating said piezo-vibrator, lead terminals coupled to said semiconductor element, said electrode extensions of said piezo-vibrator being coupled to said lead terminals of said semiconductor element, said semiconductor element, lead terminals and piezo-vibrator being packaged in a unitary resin package formed by injecting resin through a resin port positioned proximate the outer periphery of said package proximate said end portion of said casing of said piezo-vibrator, said electrode extensions of said piezo-vibrator being positioned proximate the outer periphery of said package.

2. The piezo-oscillator of claim 1, wherein the semiconductor element and the piezo-vibrator are disposed in series.

3. The piezo-oscillator of claim 1, wherein the semiconductor element and the piezo-vibrator are disposed parallel to each other.

4. The piezo-oscillator of claim 1, further comprising a die pad, the die pad having a first side and a second opposed side, said semiconductor element being disposed on the first side of the die pad, and the piezo-vibrator being disposed on the second side of the die pad and the die pad protrudes in the direction in which the piezo-vibrator is disposed on the die pad.

5. The piezo-oscillator of claim 1, wherein the piezo-vibrator is a chip-shaped piezo-vibrator.

6. The piezo-oscillator of claim 1, wherein the resin package is formed at a temperature lower than the melting point of the materials used in constructing the piezo-oscillator.

7. The piezo-oscillator of claim 6, wherein the piezo-vibrator casing is affixed around a plug, the electrode extensions extending from the plug.

8. The piezo-oscillator of claim 7, wherein the casing and plug are constructed with solder, the solder softening at a temperature greater than about 175° C.

9. The piezo-oscillator of claim 7, wherein the casing and plug are constructed with a solder containing about 90% or more of lead.

10. The piezo-oscillator of claim 1, wherein the piezo-vibrator is a crystal vibrator.

11. A piezo-oscillator package comprising a semiconductor element including an oscillating circuit, a piezo-vibrator having vibrator leads extending outwardly therefrom, lead terminals coupling the vibrator leads to the semiconductor element, shielding lead terminals disposed parallel to the vibrator lead terminals, the semiconductor element, the lead terminals, the piezo-vibrator and the shielding lead terminals all being contained within a unitary resin package, the vibrator lead terminals being disposed proximate the outer periphery of the package.

12. The piezo-oscillator of claim 11, further including a die pad, the shielding terminals extending from the die pad to without the package, and extending between the vibrator connecting lead terminals and the second set of lead terminals parallel to the crystal vibrator connecting lead terminals.

13. The piezo-oscillator of claim 11, wherein the shielding lead terminals extend to the outside of the package.

14. A piezo-oscillator package comprising a frame having an outer periphery, a piezo-vibrator having a casing with an end portion supported on the frame, electrode extensions extending proximate the end portion of the casing, a semiconductor element having oscillating circuit means for oscillating said piezo-oscillator supported on said frame, lead terminals coupled to said semiconductor element, said electrode extensions of said piezo-vibrator being coupled to said lead terminals of said semiconductor element, a port formed in said frame proximate said end portion of said casing of said piezo-vibrator, said electrode extensions of said piezo-vibrator being positioned proximate the outer periphery of said package, said semiconductor element, lead terminal and piezo-vibrator being packaged in a resin introduced through said port.

15. The piezo-oscillator of claim 14, wherein the semiconductor element and the piezo-vibrator are disposed in series on said frame.

16. The piezo-oscillator of claim 14, wherein the semiconductor element and the piezo-vibrator are disposed parallel to each other on said frame.

17. The piezo-oscillator of claim 14, further comprising a die pad on said frame, the die pad having a first side and a second opposed side, wherein the semiconductor element being disposed on the first side of the die pad and the piezo-vibrator being disposed on the second side of the die pad and the die pad protrudes in the direction in which the piezo-vibrator is disposed on the die pad.

18. The piezo-oscillator of claim 14, wherein the piezo-vibrator is a chip-shaped piezo-vibrator.

19. The piezo-oscillator of claim 14, wherein the resin package is formed at a temperature lower than the melting point of the materials used in constructing the piezo-oscillator.

20. The piezo-oscillator of claim 14, wherein the piezo-vibrator casing is affixed around a plug, the electrode extensions extending from the plug.

21. The piezo-oscillator of claim 14, wherein the casing and plug are constructed with solder, the solder softening at a temperature greater than about 175° C.

22. The piezo-oscillator of claim 14, wherein the casing and plug are constructed with a solder containing about 90% or more of lead.

23. The piezo-oscillator of claim 14, wherein the piezo-vibrator is a crystal vibrator.

* * * * *